(12) United States Patent
Abaecherli et al.

(10) Patent No.: US 10,622,537 B2
(45) Date of Patent: Apr. 14, 2020

(54) METHOD FOR PRODUCING A SEMIFINISHED PRODUCT FOR A SUPERCONDUCTING WIRE

(71) Applicant: Bruker EAS GmbH, Hanau (DE)

(72) Inventors: Vital Abaecherli, Erlensee (DE); Klaus Schlenga, Karlsruhe (DE); Bernd Sailer, Alzenau (DE); Manfred Thoener, Biebergemuend (DE); Matheus Wanior, Gelnhausen (DE)

(73) Assignee: BRUKER EAS GMBH, Hanau (DE)

( * ) Notice: Subject to any disclaimer, the term of this patent is extended or adjusted under 35 U.S.C. 154(b) by 264 days.

(21) Appl. No.: 15/877,916

(22) Filed: Jan. 23, 2018

(65) Prior Publication Data
US 2018/0212135 A1    Jul. 26, 2018

(30) Foreign Application Priority Data
Jan. 23, 2017    (DE) .......... 10 2017 201 039

(51) Int. Cl.
*H01L 39/24*    (2006.01)
*B33Y 10/00*    (2015.01)
(Continued)

(52) U.S. Cl.
CPC .......... *H01L 39/2406* (2013.01); *B33Y 10/00* (2014.12); *H01B 12/00* (2013.01); *H01L 39/12* (2013.01)

(58) Field of Classification Search
CPC ......... B33Y 10/00; H01B 12/00; H01L 39/12; H01L 39/2406
See application file for complete search history.

(56) References Cited

U.S. PATENT DOCUMENTS

| 4,746,373 A | 5/1988 | Yamada et al. |
| 5,223,348 A | 6/1993 | Wong et al. |

(Continued)

FOREIGN PATENT DOCUMENTS

| CN | 103515022 A | 1/2014 |
| CN | 103617860 A | 3/2014 |

(Continued)

OTHER PUBLICATIONS http://netzkonstrukteur.de/fertigungstechnik/3d-druck/selektives-laserschmelzen/ retrieved from internet Jul. 6, 2016 (in German language).

(Continued)

*Primary Examiner* — Jenny R Wu
(74) *Attorney, Agent, or Firm* — Edell, Shapiro & Finnan, LLC (57) ABSTRACT

A method for producing a semifinished product for a superconducting wire is provided herein. The semifinished product includes at least one NbTi-containing structure, such as a NbTi-containing rod structure. The NbTi-containing structure may be produced in layers by selective laser melting or selective electron beam melting of a powder that contains Nb and Ti. In the production of at least some layers of the NbTi-containing structure, during the production of an irradiated area provided for a material deposition of a respective layer, at least one process parameter of the selective laser melting or electron beam melting is varied in one or a plurality of first zones of the irradiated area as compared to one or a plurality of second zones of the irradiated area. The present techniques simplify introduction of artificial pinning centers into the NbTi-material of a superconducting wire or a semifinished product for such a superconducting wire.

21 Claims, 5 Drawing Sheets

(51) Int. Cl.
H01B 12/00 (2006.01)
H01L 39/12 (2006.01)

(56) References Cited

U.S. PATENT DOCUMENTS

| 9,023,765 | B1 | 5/2015 | Rimmer et al. |
| 2013/0345062 | A1 | 12/2013 | Szulczyk |
| 2015/0044084 | A1 | 2/2015 | Hofmann et al. |

FOREIGN PATENT DOCUMENTS

| DE | 1483365 | A1 | 9/1969 |
| DE | 202012102334 | U1 | 7/2012 |
| EP | 2696381 | A1 | 2/2014 |
| GB | 1097418 | A | 9/1917 |
| GB | 1272656 | A | 5/1972 |
| JP | S55024207 | A | 6/1980 |
| JP | H03283478 | A | 12/1991 |
| JP | H06275145 | A | 9/1994 |
| JP | 2014035860 | A | 2/2014 |
| WO | 9302222 | A1 | 2/1993 |
| WO | 2007147221 | A1 | 12/2007 |

OTHER PUBLICATIONS http://netzkonstrukteur.de/fertigungstechnik/3d-druck/selektives-elektronenstrahlschmelzen/ retrieved from internet Nov. 22, 2016 (in German language).

Terrazas, C.A. et al., "EBM Fabrication and Characterization of High Purity Niobium for Superconductor Applications", 25th Annual International Solid Freeform Fabrication Symposium, 2014, htthps://sffsymposium.engr.utexas.edu/2014TOC, retrieved from internet Oct. 25, 2017.

METHOD FOR PRODUCING A SEMIFINISHED PRODUCT FOR A SUPERCONDUCTING WIRE

CROSS REFERENCE TO RELATED APPLICATIONS

The following disclosure is based on and claims the benefit of and priority under 35 U.S.C. § 119(a) to German Patent Application No. 102017201039.8, filed Jan. 23, 2017, and the disclosure of which is incorporated in its entirety into the present application by reference.

FIELD OF THE INVENTION

The invention relates to a method for producing a semifinished product for a superconducting wire, wherein the semifinished product comprises at least one NbTi-containing structure, such as an NbTi-containing rod structure.

BACKGROUND

NbTi superconducting wires are used to conduct high electric currents with virtually no dissipation loss, particularly in superconducting magnetic coils for generating strong magnetic fields. In this case, NbTi has the advantage of favorable ductility, which facilitates processing of the material; for example, favorable plastic deformation is possible.

The current-carrying capacity of an NbTi superconducting wire can be improved by means of artificial pinning centers in the superconducting material that hold the magnetic flux tubes in place.

A frequently used method of incorporating pinning centers into NbTi material uses a succession of heat treatments and tensile deformations ("rod and wire drawing"). This results in depositions at the NbTi grain boundaries of $\alpha$-Ti that act as pinning centers. Furthermore, the method is known for incorporating filaments of a transition metal (such as niobium, titanium, or vanadium) into an NbTi matrix, which act as artificial pinning centers. The method has also become known for assembling niobium and titanium in alternating layers into a blank, drawing the blank, and then bundling it into a second blank. The second blank is subjected to the hot isostatic pressing (HIP) process, extruded, and formed into a wire. NbTi is produced at the interfaces of Ti and Nb, but a normally conductive material is left over because of the insufficient reaction. The method is also known for enclosing stacks of alternating Nb layers and Ti layers in Nb and inserting them into a copper extrusion sleeve. After the HIP process, extrusion, and drawing, the extrusion sleeve is removed and the obtained filaments are stacked. After this, they are again introduced into a Cu extrusion sleeve, subjected to a HIP process, extruded, and drawn, the extrusion sleeve is removed, and the filaments are again stacked and surrounded with Nb. By again carrying out insertion into a Cu extrusion sleeve, a HIP process, extruding, and drawing, a finished NbTi-containing wire is finally obtained. These methods are summarized for example in U.S. Pat. No. 5,223,348.

The introduction of pinning centers into a NbTi superconducting material by known methods is complex and difficult. A highly precise process is required for deposition of $\alpha$-titanium. Complex mechanical combination steps are required for inserting other materials into a NbTi matrix; the same applies to the combination of alternating layers of Nb and Ti.

In order to produce metallic components based on CAD data, the method has become known for producing the component in layers by local melting of a metal powder with a laser beam or electron beam ("selective laser melting" or "selective electron beam melting"), for example, the web page http://netzkonstrukteur.de/fertigungstechnik/3d-druck/selektives-laserschmelzen/, or the web page http://netzkonstrukteur.de/fertigungstechnik/3d-druck/selektives-elektronenstrahlschmelzen/. This production method requires no negative molds and allows undercuts.

SUMMARY

The object of the invention is to simplify the introduction of artificial pinning centers into the NbTi-material of a superconducting wire or a semifinished product for such a superconducting wire.

This object may be achieved by a method of the above-mentioned type, wherein the NbTi-containing structure is produced in layers by selective laser melting or selective electron beam melting of a powder that contains Nb and Ti, and wherein, in the production of at least some layers of the NbTi-containing structure, during the production of an irradiated area of a respective layer provided for a material deposition, one or a plurality of process parameters of the selective laser melting or electron beam melting in one or a plurality of first zones of the irradiated area are varied compared to one or a plurality of second zones of the irradiated area.

Within the framework of embodiments of the invention, a NbTi-containing structure which is used in a semifinished product for a NbTi superconducting wire or directly as a semifinished product for a NbTi superconducting wire is produced by layered selective laser melting or electron beam melting of a powder (pulverulent material). Layered production of a structure by selective laser melting or electron beam melting is also known in the area of additive manufacturing.

In this process, an area is provided in each layer that is passed over by the laser beam or electron beam and thus locally melted so that the powder grains in this area are bonded to one another (the "laser-irradiated area" or "electron-beam-irradiated area", also abbreviated as the "irradiated area"). The laser-irradiated or electron-beam-irradiated area can also comprise a plurality of unlinked partial areas. In addition, in general, another area of a respective layer is not passed over by the laser beam or electron beam, so that the powder grains in this area are not bonded to one another (the "non-irradiated area"). The non-irradiated area can also comprise a plurality of unlinked partial areas. A plurality of layers is produced one after the other and one atop the other, in most cases at least 100 layers or more, wherein in each layer, the respective laser-irradiated or electron-beam-irradiated area is solidified. After production of all of the layers, the remaining powder is removed, and the NbTi-containing structure is retained.

In the method provided according to embodiments of the invention, in production of the NbTi-containing structure, at least a few (and optionally all) of the layers in the respective laser-irradiated or electron-beam-irradiated areas are not subjected to homogeneous laser melt processing or electron beam melt processing, but the laser-irradiated or electron-beam-irradiated area is divided into one or a plurality of first zones and one or a plurality of second zones. In the first zone(s), the laser melting or electron beam melting is carried out with process parameters differing from those in the second zone(s). In this manner, the solidified material obtained in the first zone(s) ("first material") differs from the solidified material obtained in the second zone(s) ("second material").

The various zones with different obtained materials cause the movement of the magnetic flux tubes to be hindered. The interface or interfaces between the zones, the zone or zones of one type (such as the second zones), or components of the zone or zones of one type (such as the second zones) act as artificial pinning centers.

The method is typically carried out in such a manner that one of the materials obtained (such as the first material) is superconducting, for example with a $Nb_{53wt.\%}Ti_{47wt.\%}$ phase, and the other material (such as the second material) is not superconducting, or in any event has an increased content of a non-superconducting phase or phases, such as a pure Nb phase or e.g., a $Nb_{60wt.\%}Ti_{40wt.\%}$ phase (=$Nb_{44at\%}Ti_{56at\%}$ phase).

The differing process parameters in laser melting or electron beam melting between the first zone(s) and the second zone(s) make it possible to influence the chemical composition, the phase distribution and/or the structure of the first and second material. For example, evaporation, melting, diffusion, hardening, deposition, and crystallization processes can be influenced by the parameters of the selective laser melting or electron beam melting.

Modifying the parameters of the laser melting or electron beam melting is relatively simple, and in layered production, the interior of the NbTi-containing structure to be produced can be accessed without problems. This allows artificial pinning centers to be placed in virtually any desired location in the NbTi-containing structure to be produced. For example, it is also easy to introduce a large number of artificial pinning centers with a relatively low volume percentage of the overall structure, which improves superconducting current-carrying capacity. The NbTi-containing structure may be composed to at least 80 wt. %, to at least 95 wt. %, or to at least 99 wt. % of a superconducting NbTi phase.

A NbTi-containing structure typically has a length L of between 30 cm and 1.50 m, or a length of between 50 cm and 1 m, and further typically has a diameter D of between 5 cm and 50 cm, or a diameter of between 10 cm and 25 cm (ingot applications), or a diameter of between 5 mm and 100 mm (application for direct use in the matrix). The NbTi-containing structure typically has a constant external cross-section along an axial direction ("rod structure").

According to embodiments of the invention, in selective laser melting or electron beam melting in the second zone(s), the content of Ti is degraded with respect to the first zone(s). In this manner, one can easily produce, from a powder composition with an ordinary composition ratio suitable for the superconducting $Nb_{53wt.\%}Ti_{47wt.\%}$ phase, a $Nb_{60wt.\%}Ti_{40wt.\%}$ phase (=$Nb_{44at\%}Ti_{56at\%}$ phase) that is not superconducting (at an ordinary use temperature of 4.2 K) and is well-suited for the formation of artificial pinning centers. For degrading the Ti, the significantly lower boiling point of Ti compared to Nb can be used. In shorter application times or lower beam power on application of the laser beam or electron beam to a local pulverulent material or a local melt bath, there will be no or little degradation of Ti, and using longer application times or higher beam power, the degradation of Ti can be forced.

Another variant provides that in selective laser melting or electron beam melting in the second zone(s), a maximum temperature of a melt bath is increased with respect to the first zone(s). In this manner, degradation of Ti, which has a lower boiling point (3287° C.) than Nb (4927° C.), can be promoted. Typically, the maximum melt bath temperature in a second zone is in the range of the boiling point of Ti (approx. 3200-3300° C.), and in a first zone, it is significantly lower (approx. 1800-3000° C.). The maximum melt bath temperature in the first zone, however, is above the melting points of Ti (1668° C.) and Nb (2469° C.).

A variant is provided that, in selective laser melting or electron beam melting in the second zone(s), a local residence time of a melt bath is increased with respect to the first zone(s). This prolongs the time for evaporation processes from the melt bath in a second zone, which allows the chemical composition to be modified, for example, in order to degrade Ti. The residence time can easily be influenced by controlling the laser beam or electron beam or the reference point thereof, for example, a mirror system that can be displaced and/or pivoted using a motor or an electrically controllable lens system.

In another variant, in selective laser melting or electron beam melting in the second zone(s), a beam power is increased with respect to the first zone(s). Using the beam power (laser power or electron beam power), the energy input in the irradiated powder can be modified, for example, in order to influence the temperature of the melt bath. In this variant, if desired, the laser beam or electron beam can be uniformly guided over the irradiated area.

In another variant in selective laser melting or electron beam melting in the second zone(s), a feed rate of a reference point of a laser beam or electron beam is reduced with respect to a feed rate of the reference point in the first zone(s). By reducing the feed rate, the energy input per area covered can be increased, for example, in order to increase the temperature of the melt bath. The feed rate can easily be influenced by controlling the laser beam or electron beam or the reference point thereof, for example, with a mirror system that can be displaced and/or pivoted using a motor or an electrically controllable lens system.

Another variant is provided that in selective laser melting or electron beam melting in the second zone(s), the focusing of the laser beam or electron beam is modified with respect to the first zone(s). In this manner, the energy input per unit area can be influenced. Typically, the laser beam or electron beam in the second zone(s) is narrowed with respect to the first zone(s).

In another variant in selective laser melting or electron beam melting in the first zone(s), a first laser source or electron gun is used, and in selective laser melting or electron beam melting in the second zone(s), a second laser source or electron gun is used alternatively or in addition to the first laser source or electron gun. This allows the locally acting beam power to be modified without requiring adjustment of the power of an individual laser or an individual electron gun.

In another variant, the NbTi-containing structure is produced with a length L in the longitudinal direction and a maximum diameter D perpendicular to the longitudinal direction, where L≥3*D, L≥4*D, or L≥5*D. The selective laser melting or electron beam melting used according to embodiments of the invention is also well-suited for producing larger L/D aspect ratios. Furthermore, it is also readily possible to configure large aspect ratios of the (linear) maximum extension MA of a (usually second) zone transverse to the longitudinal direction in relation to the length L in the longitudinal direction. In most cases, L≥10*MA, or even L≥30*MA. Corresponding aspect ratios can be produced mechanically (for example, by boring and the use of filling rods) only with great expense and difficulty.

In another variant of the method, the NbTi-containing structure is produced in layers perpendicular to its longitudinal axis. In this manner, any planar defects or non-superconducting areas produced between two layers are oriented parallel to the longitudinal direction and thus parallel to the current flow direction and therefore have a minor influence on the current-carrying capacity. Accordingly, particularly high current-carrying capacities of the finished NbTi superconducting wire are possible in this process. It should be noted that for this variant the pulverulent material and the laser beam or electron beam must be distributed or guided over a relatively long distance or a large production area; however, only a minimal lifting height is required.

In another variant, the NbTi-containing structure is produced layered along its longitudinal direction. In this case, a relatively small structural platform can be used.

A variant method is also provided in which each of the one or plurality of second zones in the irradiated area has a maximum extension of between 5 μm and 1000 μm. The maximum (linear) extension MA is measured in a direction perpendicular to the longitudinal direction/current carrying direction. In most cases, the maximum extensions MA are 20 μm or more, and often 40 μm or more. Moreover, the maximum extensions MA are usually 500 μm or less, and often 250 μm or less. Such maximum extensions MA can be produced relatively simply by the method according to embodiments of the invention, in contrast to mechanical methods.

In another variant, it is provided that in successive layers, second zones do not overlap, preferably wherein second zones do not overlap over at least five successive layers. This prevents the occurrence in the production direction of larger contiguous non-superconducting areas in the NbTi-containing structure. This variant is primarily used when the production direction (direction in which the layers follow one another) is perpendicular to the longitudinal axis.

In another variant, it is provided that second zones in successive layers at least partially overlap, so that in the NbTi-containing structure, a contiguous spatial structure of second zones is formed. This variant makes it possible to arrange areas for flux tubes in a highly selective manner, and for example, to selectively adapt them to the orientation of an external magnetic field. This can also allow the current-carrying capacity to be increased. This variant is primarily used when the production direction (direction in which the layers follow one another) is along the longitudinal axis.

In another variant method, the NbTi-containing structure is subjected to a deformation that reduces the cross-section. In this deformation that reduces the cross-section, compression can also be carried out. A deformation that reduces the cross-section takes place after layered production of the NbTi structure in the ingot dimension, so that the deformed NbTi structure can then be used in a cladding tube or in a semifinished product block. Moreover, by using deformation that reduces the cross-section, which is accompanied by lengthening in the longitudinal direction, a desired dimensioning with respect to the final superconducting wire can be achieved (optionally, also in multiple stages via intermediate bundles). In addition, the pinning centers are elongated in the longitudinal direction. For deformation that reduces the cross-section, one can use e.g. extruding, drawing, or hot isostatic pressing.

A variant is also provided in which, after production of the NbTi-containing structure, this structure is inserted into a cladding tube, such as a Cu cladding tube. The cladding tube can be used in the finished superconducting wire for electrical stabilizing or as a substitute current path in the case of quenching, and can also improve mechanical drawing properties. A cladding tube can be used before or after a deformation that reduces the cross-section.

Another variant that provides a plurality of NbTi-containing structures, such as at least 6 NbTi-containing structures, is produced in layers by selective laser melting or electron beam melting and then inserted into recesses of a semifinished product block, such as a Cu semifinished product block. The semifinished block can serve in the finished superconducting wire for electrical stabilization or as a substitute current path in the case of quenching, and also improve mechanical drawing properties. A cladding tube can be used before or after a deformation that reduces the cross-section. A plurality (often more than 50) of NbTi-containing structures can be built into the surrounding block.

A variant is also provided in which the one or plurality of second zones is distributed essentially uniformly in the irradiated area. This makes it possible to optimize the current-carrying capacity in the superconducting wire: transverse currents are prevented.

A semifinished product for a superconducting wire wherein the semifinished product comprises at least one NbTi-containing structure produced according to an above-described method according to embodiments of the invention, also falls within the scope of the present invention embodiments. The semifinished product, into which pinning centers can be incorporated in a simple manner, can also be used to produce a superconducting wire having a high current-carrying capacity.

Further advantages are provided from the description and the drawing. According to aspects of the invention, the features mentioned above and explained in further detail below can also be used individually or in any desired combinations. The embodiments shown and described are not to be understood as constituting an exhaustive enumeration, but are representative in nature for describing the invention.

BRIEF DESCRIPTION OF THE DRAWINGS

Aspects of the invention are shown in the drawings and are explained in greater detail by examples. The figures, which are not to scale, show the following.

DETAILED DESCRIPTION

Figure 1:
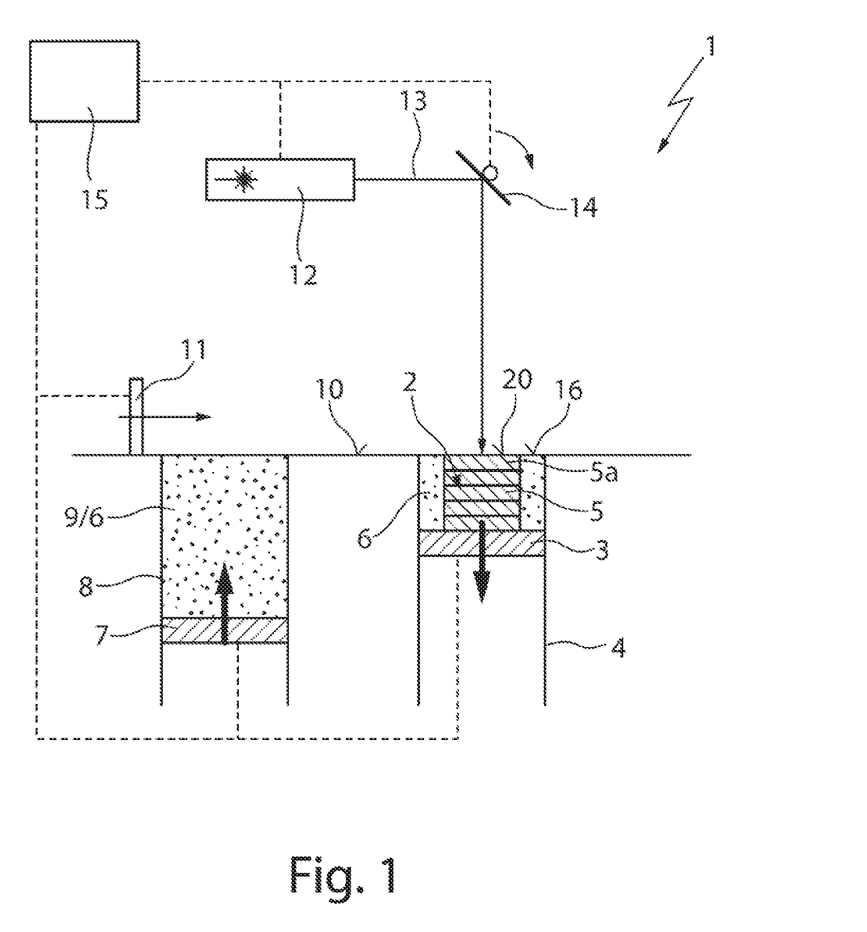
FIG. 1 is a schematic view of an apparatus for production of an NbTi-containing structure of a semifinished product for a superconducting wire, with selective laser melting of a powder according to embodiments of the invention.

FIG. 1 shows a schematic, partially cutaway view of an apparatus 1 for the layered production according to embodiments of the invention of an NbTi-containing structure 2 of a semifinished product for a superconducting wire using selective laser melting.

The apparatus 1 comprises a structural platform 3 that is vertically displaceable in a guide 4. A partially produced NbTi-containing structure 2, several layers 5 of which have already been produced, is arranged on the structural platform 3.

A reservoir 9 with powder (pulverulent material) 6 is further provided, wherein a powder bottom 7 is vertically displaceable in a guide 8. By raising the powder bottom 7, a small amount of pulverulent material 6 rises above the level of an apparatus bottom 10, so that this pulverulent material 6 can be brought via a horizontally displaceable slider 11 to the structural platform 3. In the example shown, the pulverulent material 6 is a mixture of elemental titanium and elemental niobium.

A laser 12 is further provided, the laser beam 13 of which can be directed via a pivotable and/or displaceable mirror system 14 onto the entire surface of the structural platform 3.

The laser 12 (and the power thereof), the mirror system 14, the slider 11, the structural platform 3 and the powder bottom 7 can be automatically controlled via an electronic control device 15. The control contains CAD data on the NbTi-containing structure to be produced 2.

In order to produce a new, uppermost layer 5a of the NbTi-containing structure 2, the structural platform 3 is lowered by one layer thickness (usually approx. 25 μm-100 μm), the powder bottom 7 is moved somewhat upward, and using the slider 11, pulverulent material 6 is filled above the structural platform 3 and the partially produced NbTi-containing structure 2 is brought to the level of the apparatus bottom 10 and smoothed flat. The laser beam 13 or the reference point thereof then passes over an area (irradiated area) 20 provided in this layer 5a. The pulverulent material 6 is melted and solidified in this area. Ordinarily, a protective gas atmosphere (such as $N_2$ or Ar or a vacuum) is present at least around the uppermost layer 5a in order to prevent oxidation processes on the hot or molten material. The pulverulent material 6 remains loose in the non-irradiated area 16.

Figure 9:
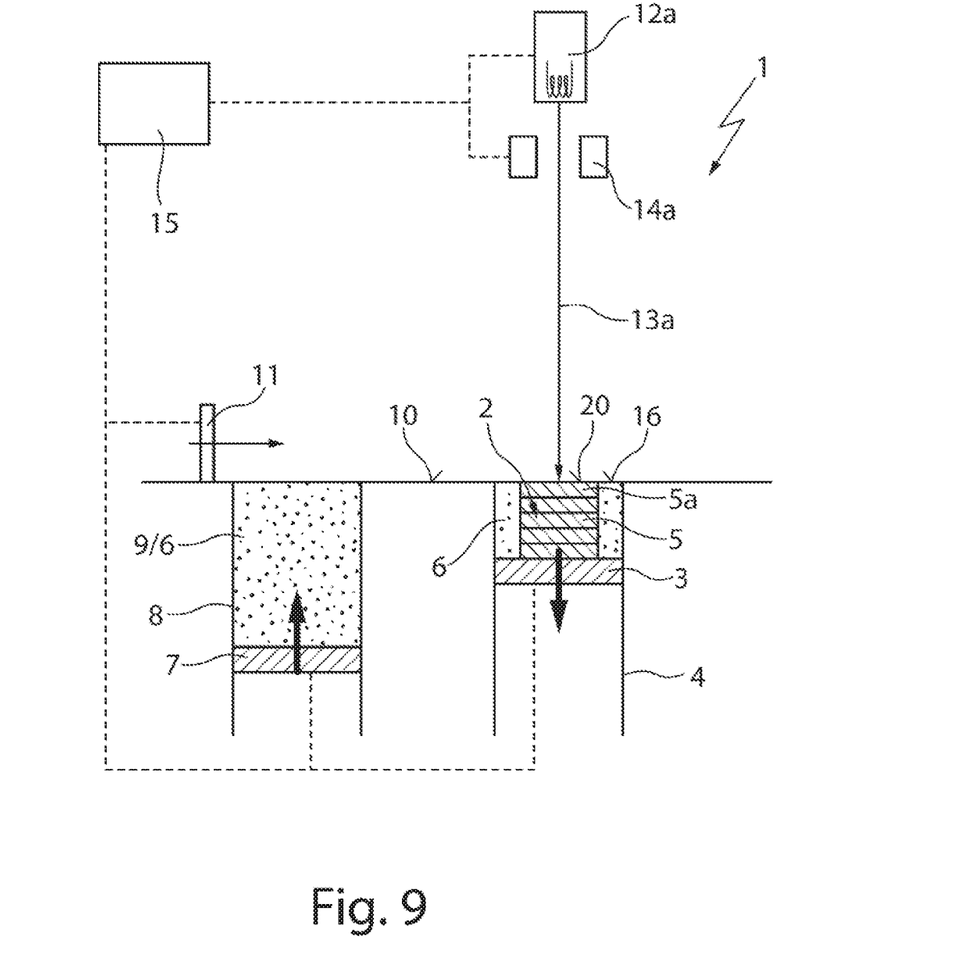
FIG. 9 is a schematic view of an apparatus for production of an NbTi-containing structure of a semifinished product for a superconducting wire, with selective electron beam melting of a powder according to embodiments of the invention.

FIG. 9 shows an alternative apparatus 1 for the layered production of an NbTi-containing structure 2 of a semifinished product for a superconducting wire by means of selective laser melting. As this apparatus 1 largely corresponds to the apparatus of FIG. 1, only the essential differences will be discussed here.

By means of an electron gun 12a, an electron beam 13a is produced that is deflected using a lens system 14a. The electron beam 13a scans the area provided in the uppermost layer 5a of the powder 6 on the structural platform 3. For this purpose, the electron gun 12a (and the power thereof as well) and the lens system 14a are automatically controlled by the control device 15 in a corresponding manner. The energy of the electrons in the electron beam 13a causes the powder 6 in the irradiated area 20 to be melted and solidified. The electron beam 13a propagates under a vacuum.

Figure 2:
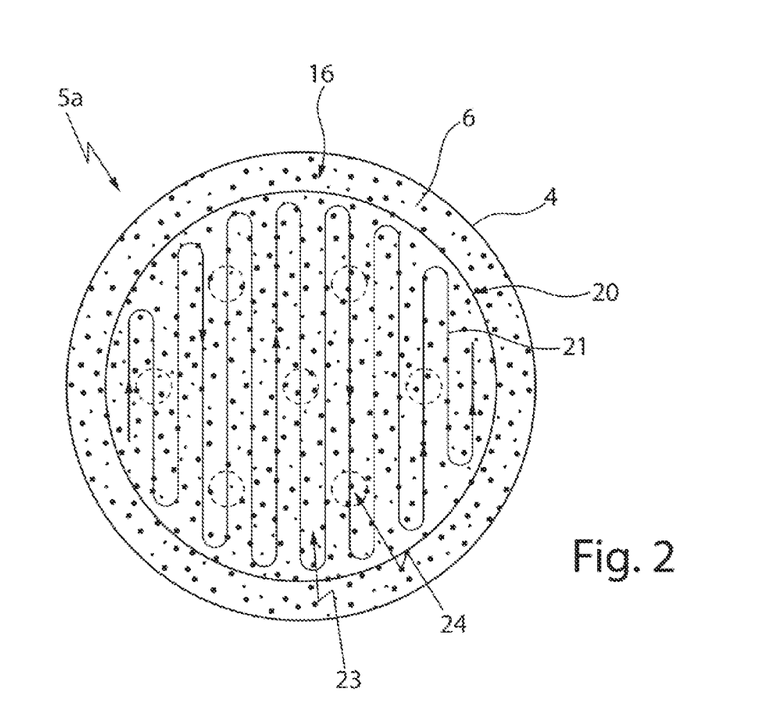
FIG. 2 is a top view of a layer to be produced of an NbTi-containing structure, with marking of the path of the beam reference point and first and second zones, according to embodiments of the invention.

FIG. 2 shows a top view of a uppermost layer 5a of pulverulent material 6 in the guide 4. In the example shown, a disk-shaped irradiated area 20 is provided for material deposition, i.e. for solidifying pulverulent material 6; a ring-shaped outer layer 16 is not irradiated with the laser or the electron gun.

The irradiated area 20 is covered/passed through by a trajectory 21 for the reference point of the laser beam or electron beam such that the entire area 20 is solidified after exposure to the beam. In this case, in laser melt processing or electron melt processing, the beam follows the trajectory 21 (also, the arrow directions).

In this case, according to embodiments of the invention, laser melt processing or electron melt processing is provided that can be modified via the trajectory 21. Most of the trajectory 21 falls within a first zone 23, and a small part of the trajectory 21 falls within seven second zones 24 (shown with dashed edges). Pinning centers for flux tubes are to be configured in the dashed zones 24. For this purpose, at least one parameter of the laser processing or electron beam processing is modified in the first zone 23 compared to the second zones 24. In this manner, the solidified material in the first zone 23 takes on properties different from those in the second zones 24.

In the example illustrated, it is provided that the beam or the reference point thereof is allowed to proceed in the first zone 23 at a first constant feed rate v1 on the trajectory 21 and in the second zones 24 at a second constant feed rate v2. In this case, the second feed rate v2 is significantly lower than the first feed rate v1, for example $v2 \leq \frac{1}{3} \ast v1$.

Figure 3:
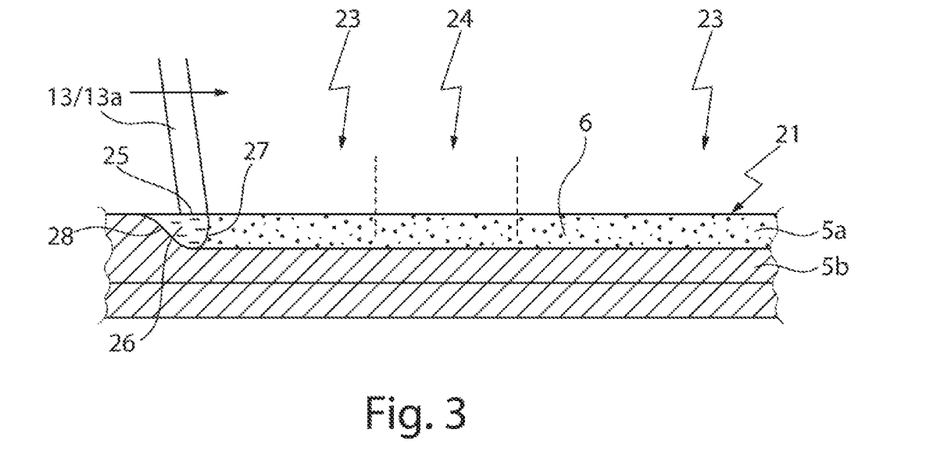
FIG. 3 is a schematic section through a layer being produced according to embodiments of the invention.

FIG. 3 illustrates a schematic cross-section of the progress of the laser beam 13 or electron beam 13a on a partial section of the trajectory 21 (which runs from left to right in FIG. 3). The laser beam 13 or electron beam 13a produces a melt bath 26 in the area around its reference point 25 from the local pulverulent material 6 in the uppermost layer 5a; in this case, the (already produced, solidified) layer 5b lying thereunder can also be slightly melted. At the front edge 27 of the melt bath 26, pulverulent material 6 is melted, and at the rear edge 28 of the melt bath 26, the melt bath 26 sets as solidified material.

At a higher feed rate (v1 in the first zone 23), the temperature of the melt bath 26 is below the temperature at a lower feed rate (v2 in the second zone 24). The reason for this is that (provided the beam power remains constant) at a lower feed rate per amount of material to be melted, more energy is available. At a higher melt bath temperature, there is increased evaporation of melt bath components, depending on the component in question (in particular on the boiling point thereof). In a mixture of liquid Nb and liquid Ti, the Ti evaporates more strongly than the Nb, as Ti has a significantly lower boiling point or vapor pressure than Nb. While evaporation processes overall are quite minimal and thus not relevant at a lower temperature (in the first zone 23), at a higher temperature (in the second zone 24), a considerable amount of Ti evaporates, while at the same time, a small amount of Nb evaporates. As a result, Ti is therefore significantly degraded in the melt bath 26 at a higher temperature (in the second zone 24). In addition, because of the slower feed rate in the second zone 24, the residence time of the melt bath 26 at a given point on the trajectory 21 is prolonged with respect to the first zone 23, which also promotes degradation of the more readily volatile Ti.

As a result, different phases are formed in the first zone 23 and in the second zone 24. In the second zone 24 for example, non-superconducting phases such as Nb and/or $Nb_{60wt.\%}Ti_{40wt.\%}$ phase (=$Nb_{44at\%}Ti_{56at\%}$ phase) lead to the formation of artificial pinning centers in the second zones. In this manner, the superconducting current-carrying capacity in the NbTi-containing structure is improved.

It should be noted that alternatively or additionally to a slowed feed rate of the laser beam or electron beam, the beam power in the second zones can also be increased, for example, or another beam source or at the same time a second beam source can also be used in the second zones, or the focussing of the beam can also be narrowed, which also leads to a higher melt bath temperature in the second zones 24.

Figure 4:
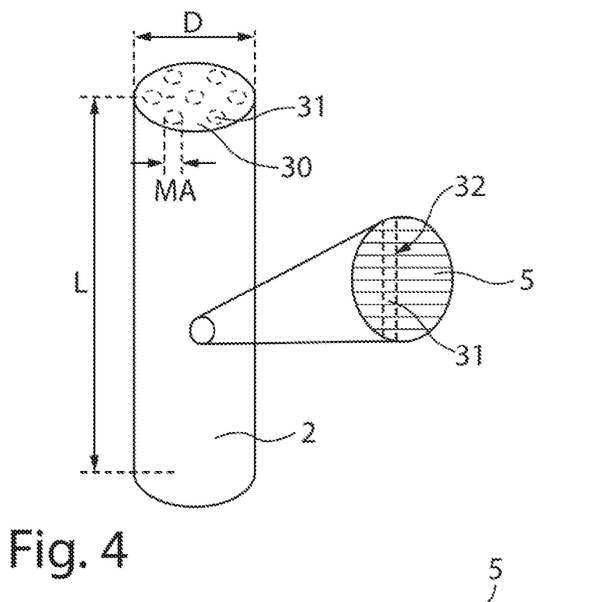
FIG. 4 is a schematic view of an NbTi-containing structure, with a production direction along the longitudinal axis, produced by the method according to embodiments of the invention.

FIG. 4 shows an example of an NbTi-containing structure 2 for a semifinished product which was produced by a method according to embodiments of the invention.

Here, the NbTi-containing structure 2 is essentially of cylindrical shape, with a length L in the longitudinal direction (from top to bottom in FIG. 4) and a diameter D perpendicular to the longitudinal axis. The NbTi-containing structure 2 comprises a matrix 30 (corresponding to a first zone) composed of superconducting NbTi, and in this case, seven inclusions 31 (corresponding to second zones) containing one or a plurality of non-superconducting phases. The inclusions 31 act as pinning centers for flux tubes in the superconducting state of the NbTi-containing structure 2. The inclusions 31 have a rod-shaped configuration and extend through the entire length L of the NbTi-containing structure 2 in a straight line. In the cross-section of the NbTi-containing structure 2, the inclusions 31 are distributed approximately evenly, shown here on a hexagonal grid.

In this case, the length L is approx. 3 times larger than the diameter D. The inclusions 31 have a maximum extension MA (diameter) transversely to the longitudinal direction that corresponds to less than $\frac{1}{10}$ of the diameter D of the NbTi-containing structure 2. $MA \leq \frac{1}{30}*L$ thus also applies.

The NbTi-containing structure 2 was produced along the longitudinal direction, so that the layers 5 in the longitudinal direction follow one another, see the enlarged section in FIG. 4. In order to form the rod-shaped inclusions 31, the respective second zones in the successive layers 5 are arranged in overlapping fashion; each rod-shaped inclusion 31 can therefore be understood as a contiguous spatial structure 32 of second zones. The NbTi-containing structure 2 can be produced using a relatively small apparatus (e.g., FIG. 1 or FIG. 9).

Figure 5:
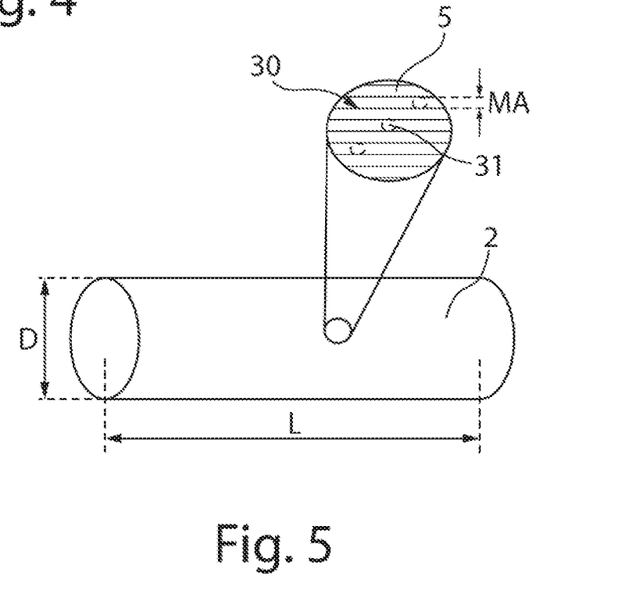
FIG. 5 is a schematic view of another NbTi-containing structure, with a production direction perpendicular to the longitudinal axis, produced by the method according to embodiments of the invention.

FIG. 5 shows a further example of a NbTi-containing structure 2 for a semifinished product that was produced by a method according to embodiments of the invention.

In this case, the NbTi-containing structure 2 is essentially cylindrical in shape, with a length L in the longitudinal direction (from left to right in FIG. 5) and a diameter D perpendicular to the longitudinal axis. The NbTi-containing structure 2 comprises a matrix 30 (corresponding to a first zone) composed of superconducting NbTi and a plurality of inclusions 31 (corresponding to second zones) containing one or a plurality of non-superconducting phases. The inclusions 31 act as pinning centers for flux tubes in the superconducting state of the NbTi-containing structure 2. Here, the inclusions 31 have an approximately spherical configuration and are arranged distributed in the NbTi-containing structure 2. In this manner, overlapping of various inclusions 31 in successive layers 5 is prevented (see also the enlarged section in FIG. 5).

In this case, the length L is more than 3 times greater than the diameter D. The inclusions 31 have a maximum extension MA (diameter) transversely to the longitudinal direction that corresponds to less than $\frac{1}{10}$ of the diameter D of the NbTi-containing structure 2. $MA \leq \frac{1}{30}*L$ thus also applies.

The NbTi-containing structure 2 was produced transversely to the longitudinal direction produced so that layers 5 lie successively parallel to the longitudinal direction and perpendicular to the longitudinal direction, see the enlarged section in FIG. 5. This ensures that any planar defects or non-superconducting areas between successive layers 5 do not obstruct a superconducting current flow in the longitudinal direction.

Figures 6, 7:
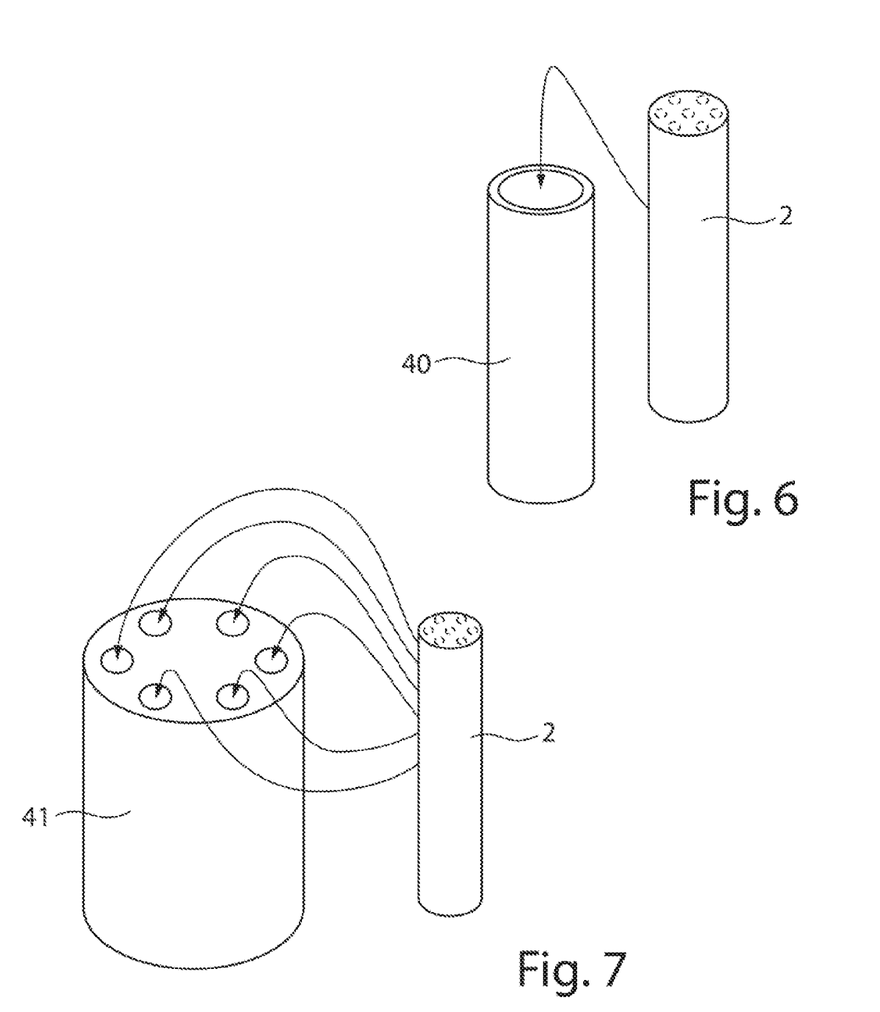
FIG. 6 is a schematic illustration of the introduction of an NbTi-containing structure into a cladding tube in another method according to embodiments of the invention.
FIG. 7 is a schematic illustration of the introduction of six NbTi-containing structures into a semifinished block in another method according to embodiments of the invention.

FIG. 6 schematically illustrates the insertion of an NbTi-containing structure 2, such as that shown for example in FIG. 4, into a cladding tube 40 according to embodiments of the invention for producing a semifinished product. In other embodiments, a plurality of NbTi-containing semifinished products 2 may be inserted into a semifinished block 41, as shown schematically in FIG. 7, for producing a semifinished product. However, it should be noted that an NbTi-containing structure 2 alone can also constitute a semifinished product of a superconducting wire.

Figure 8:
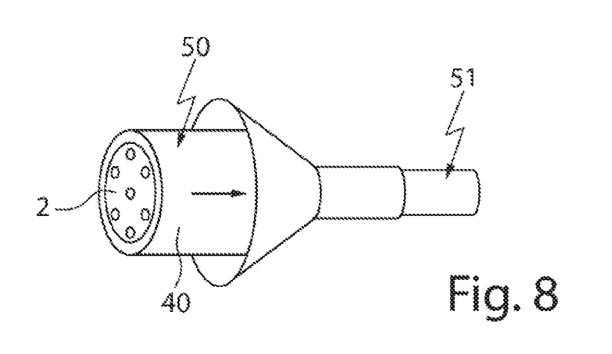
FIG. 8 is a schematic illustration of a cross-sectional reduction of a semifinished product in another method according to embodiments of the invention.

Finally, FIG. 8 shows how a semifinished product 50, composed in this case of a cladding tube 40 and an NbTi-containing structure 2, is extruded, thus obtaining a semifinished product having a reduced cross-section 51. Using cross-sectional reduction and bundling, optionally carried out multiple times, superconducting wires with numerous individual superconducting filaments can be obtained.

LIST OF REFERENCE SIGNS

1 Apparatus
2 NbTi-containing structure
3 Structural platform
4 Guide
5 Layer
5a Uppermost layer
5b Layer lying thereunder
6 Powder/pulverulent material
7 Powder bottom
8 Guide
9 Reservoir
10 Apparatus bottom
11 Slider
12 Laser (laser source)
12a Electron gun
13 Laser beam
13a Electron beam
14 Mirror system
14a Lens system
15 Electronic control
16 Non-irradiated area
20 Irradiated area
21 Trajectory
23 First zone
24 Second zone
25 Reference point
26 Melt bath
27 Front edge
28 Rear edge
30 Matrix
31 Inclusion
32 Contiguous spatial structure
40 Cladding tube
41 Semifinished block 50 Semifinished product
51 Semifinished product after cross section reduction
D Diameter
L Length
MA Maximum extension

What is claimed is:

1. A method for producing a semifinished product for a superconducting wire,
wherein the semifinished product comprises at least one NbTi-containing structure, comprising:
producing the NbTi-containing structure in layers using selective laser melting or selective electron beam melting of a powder that contains Nb and Ti,
wherein in the production of at least some layers of the NbTi-containing structure, during the production of an irradiated area provided for material deposition of a respective layer,
one or a plurality of process parameters of the selective laser melting or the electron beam melting is/are varied in one or a plurality of first zone(s) of the irradiated area as compared to one or a plurality of second zone(s) of the irradiated area.

2. The method as claimed in claim 1, wherein during the selective laser melting or the electron beam melting in the second zone(s), a content of Ti is degraded as compared to the first zone(s).

3. The method as claimed in claim 1, wherein during the selective laser melting or the electron beam melting in the second zone(s), a maximum temperature of a melt bath is increased with respect to the first zone(s).

4. The method as claimed in claim 1, wherein during the selective laser melting or the electron beam melting in the second zone(s), a local residence time of a melt bath is increased with respect to the first zone(s).

5. The method as claimed in claim 1, wherein during the selective laser melting or the electron beam melting in the second zone(s), a beam power is increased with respect to the first zone(s).

6. The method as claimed in claim 1, wherein during the selective laser melting or the electron beam melting in the second zone(s), a feed rate of a reference point of a laser beam or electron beam is decreased with respect to a feed rate (v1) of the reference point in the first zone(s).

7. The method as claimed in claim 1, wherein during the selective laser melting or the electron beam melting in the second zone(s), the focusing of the laser beam or electron beam is modified with respect to the first zone(s).

8. The method as claimed in claim 1, further comprising:
using, during the selective laser melting or the electron beam melting in the first zone(s), a first laser source or electron gun, and
using as an alternative or in addition to the first laser source or electron gun, during the selective laser melting or the electron beam melting in the second zone(s), a second laser source or electron gun.

9. The method as claimed in claim 1, wherein the NbTi-containing structure is produced with a length L in a longitudinal direction and a maximum diameter D perpendicular to a longitudinal axis, where $L \geq 3*D$.

10. The method as claimed in claim 9, wherein the NbTi-containing structure is produced in layers perpendicularly to the longitudinal axis.

11. The method as claimed in claim 9, wherein the NbTi-containing structure is produced in layers along the longitudinal axis.

12. The method as claimed in claim 1, wherein each of the one or plurality of second zone(s) in the irradiated area has a maximum extension of between 5 μm and 1000 μm.

13. The method as claimed in claim 1, wherein the second zone(s) do not overlap in successive layers.

14. The method as claimed in claim 1, wherein the second zone(s) at least partially overlap in successive layers, so that a contiguous spatial structure of second zone(s) forms in the NbTi-containing structure.

15. The method as claimed in claim 1, wherein the NbTi-containing structure is subjected to a deformation that reduces a cross-section of the structure.

16. The method as claimed in claim 1, wherein after production of the NbTi-containing structure, the structure is inserted into a cladding tube.

17. The method as claimed in claim 1, wherein a plurality of NbTi-containing structures are produced in layers by selective laser melting or electron beam melting and then inserted into a plurality of recesses of a semifinished product block.

18. The method as claimed in claim 1, wherein the one or plurality of second zone(s) is essentially uniformly distributed in the irradiated area.

19. The method of claim 1, wherein the at least one NbTi-containing structure is a NbTi-containing rod structure.

20. The method of claim 16, wherein the cladding tube is a Cu cladding tube.

21. The method of claim 17, wherein the plurality of NbTi structures comprises at least 6 NbTi-containing structures, and wherein the semifinished product block is a Cu semifinished product block.

* * * * *